Oct. 13, 1970 A. B. NEWTON 3,533,854

THERMOCOUPLE AND HEAT TRANSFER ASSEMBLY

Filed Sept. 2, 1969

INVENTOR
ALWIN B. NEWTON
BY Thomas B. Hunter
ATTORNEY

United States Patent Office 3,533,854
Patented Oct. 13, 1970

3,533,854
THERMOCOUPLE AND HEAT TRANSFER ASSEMBLY

Alwin B. Newton, York, Pa., assignor to Borg-Warner Corporation, Chicago, Ill., a corporation of Delaware

Filed Sept. 2, 1969, Ser. No. 854,394
Int. Cl. H01v *1/28*
U.S. Cl. 136—204 3 Claims

ABSTRACT OF THE DISCLOSURE

An annular thermoelectric element, suitable for direct transfer systems in which the current passes through the element in a radial direction. The thermoelectric element is formed with inner and outer surfaces defined by a pair of cones which have a common axis and a common apex. This construction permits tapered, press-fit connections between the conductor-heat transfer elements and inside and outside diameters of the thermoelectric elements while maintaining a constant $A/L$ ratio across the entire element.

BACKGROUND AND SUMMARY OF THE INVENTION

In copending application, Ser. No. 222,371, filed Sept. 10, 1962, a thermoelectric system is described wherein the heat transfer elements between adjacent P-type and N-type thermoelectric elements, or billets, are arranged to function as conductors to carry the DC electrical energy between said thermoelectric elements. This concept is referred to in the art as the *direct transfer* or *conducting fin couple* system. The direct transfer principle has attracted considerable interest since it has the advantage of avoiding the heat transfer losses through the electrical insulating film (located at the interface between the sink and the bus bars) which is commonly found in most thermoelectric (Peltier) devices, for example, U.S. Pat. 3,035,109, issued to A. C. Sheckler on May 15, 1966.

In U.S. Pat. 3,273,347, issued to T. M. Elfving on Sept. 20, 1966, there is described a direct transfer system using annular thermoelectric elements in combination with tubular conductors. This construction offers some advantages in assembly costs by eliminating a soldered connection between the thermoelectric element and the conductors, but has some disadvantages in that the thermal expansion has an adverse effect on the juncture surfaces, i.e., the thermoelectric element conductor interfaces. It has, therefore, been thought to be desirable to use a press-fit assembly in which a pair of tapered conductors are fitted into and around complementary flared (or tapered) surfaces on an annular thermoelectric element. This general form of construction, while not used in a direct transfer system, is suggested in U.S. Pat. 3,287,167, issued to J. C. McAlvay on Nov. 22, 1966.

One of the problems inherent in the latter patent is that the $A/L$ ratio, a key consideration in the design of such systems, varies continuously along its length. Unless the $A/L$ is the same at every point in the billet, there will be internal variations in the heat flow thereby creating lateral flux paths which reduce the efficiency of the device.

It should be recognized that the $A/L$ ratio in an annular billet is uniform if, and only if, the expression $$\frac{Do+Di}{Do-Di}$$

is a constant for all axial locations; where D*o* and D*i* are the inside and outside diameters of the annular billet.

In the present invention, it has been discovered that the variation in $A/L$ ratio can be completely compensated for by forming the inside and outside surfaces with a pair of cones having a common axis and a common apex. Even though D*o* and D*i* vary along the length of a tapered billet, the expression $$\frac{Do+Di}{Do-Di}$$

will be constant at any point.

It is, therefore, a principal object of the invention to provide a tapered, annular thermoelectric element in which the $A/L$ ratio is uniform at all points.

Another object of the invention is to provide a Peltier system in which the conductors and the thermoelectric elements may be press-fitted together while still providing a constant $A/L$ ratio.

Additional objects and advantages will become apparent from reading the following detailed description taken in conjunction with the drawings.

THE DRAWINGS

DETAILED DESCRIPTION OF THE INVENTION

Figure 1:
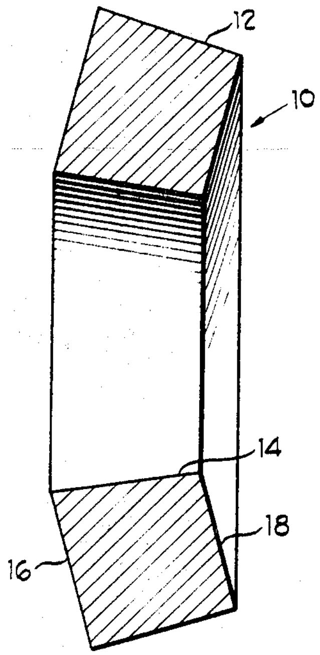
FIG. 1 is a transverse cross-section through a thermoelectric element constructed in accordance with the principles of the present invention.
Figure 2:
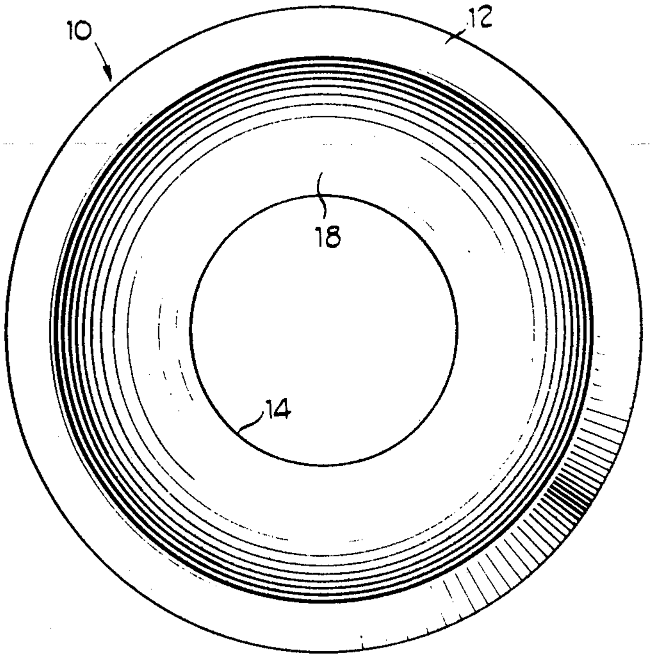
FIG. 2 is a plan view of the thermoelectric element shown in FIG. 1.

Referring now to the drawings, particularly FIGS. 1 and 2, the thermoelectric element, or billet, embodying the principles of the present invention comprises an annular body 10 having a generally circular, tapered outer surface 12 and a corresponding circular, tapered inner surface 14. The end walls 16 and 18 are preferably planar and parallel, extending normal to an imaginary cone bisecting the element. The annular form of the thermoelectric element is designed so that the current path is substantially radial either toward the axis or away from the axis depending upon its position in a couple. The thermoelectric element may be formed of any well known compositions. Examples of such materials are numerous and it is not believed necessary for a complete understanding of the invention to describe them in more detail.

Figures 3, 4:
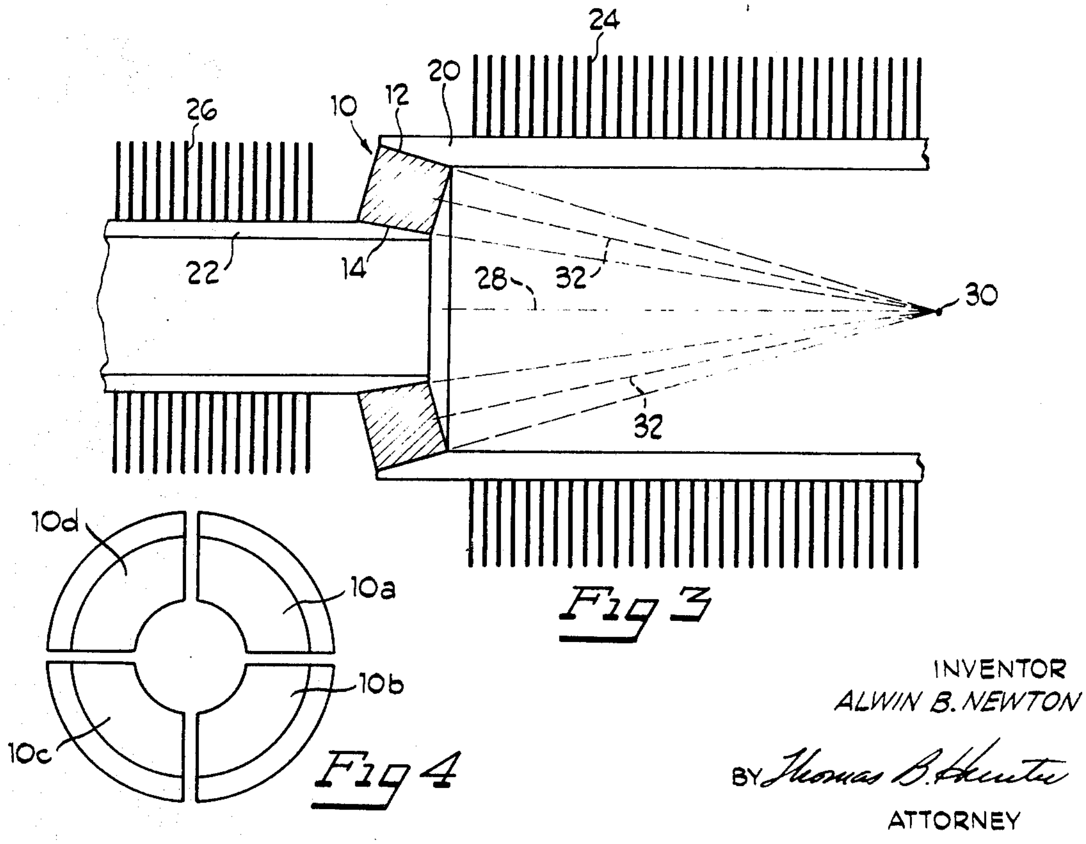
FIG. 3 is a direct transfer thermoelectric system utilizing a billet of the type shown in FIGS. 1 and 2.
FIG. 4 is a modification of the thermoelectric element shown in FIGS. 1 and 2.

In a Peltier device, it is an advantage to provide the conductors in the form of tubes, as discussed above in connection with U.S. Pat. 3,273,347. In this case, the unidirectional current is passed axially along the tubular conductor and radially through the thermoelectric element and again axially along the adjacent tubular conductor. By forming the thermoelectric element with tapered inside and outside surfaces, the tubular conductors may be press-fitted into engagement without the use of solder or other mechanical bonding techniques. As shown in FIG. 3, the thermoelectric element 10 is arranged in contact with a first tubular conductor 20 engaging the outer surface 12 and a second tubular conductor 22 having a tapered fit on the inside surface 14. To promote heat exchange (in this case, with a gaseous fluid), suitable fins 24, 26 may be formed on one or both of the tubular conductors.

Also looking at FIG. 3, an important aspect of the present invention is the conical shape of the outer and inner surfaces 12 and 14. Both of the cones (illustrated by dashed lines) which form these surfaces have a common axis 28 and a common apex 30. The end walls 16 and 18 are parallel and extend along planes which are perpendicular to an imaginary cone, shown by dashed lines 32, which bisects element 10.

The geometry of this design is such that the $A/L$ ratio is constant in every point along the axial extent of the thermoelectric element. This is true because at any point, the ratio of the inside diameter D*i* to the outside diameter D*o* is a constant; and, accordingly, the expression $$\frac{Do+Di}{Do-Di}$$

is a constant.

In FIG. 4, there is shown a modification of the thermoelectric elements referred to in FIGS. 1 to 3. In this modification, the element is formed in a series of segments 10*a*, 10*b*, 10*c*, etc., while still utilizing the conical surface geometry of the solid elements. This construction allows for the thermal expansion (radial) of the thermoelectric material during operation. Invariably, there is some resistance heating ($I^2R$) involved when the current flows through the material and the stresses, depending upon the size of the element, can be considerable. By using a segmented element, the material may expand into the spaces between adjacent segments, thereby relieving most of the stresses which would be present in a solid element.

While this invention has been described in connection with certain specific embodiments thereof, it is to be understood that this is by way of illustration and not by way of limitation; and the scope of the appended claims should be construed as broadly as the prior art will permit.

What is claimed is:

1. An annular thermoelectric element having inner and outer surfaces, each of said surfaces being defined by a portion of one of a pair of conical surfaces, said conical surfaces having a common axis and a common apex; and a pair of parallel, planar end walls.

2. A thermoelectric element as defined in claim 1, wherein said element is constructed in the form of a series of segments spaced circumferentially around said common axis.

3. A thermoelectric couple including a generally tubular conductor, said conductor having an inwardly tapered surface at a terminal portion thereof; an annular thermoelectric element having inner and outer surfaces, each of said surfaces being defined by a portion of one of a pair of conical surfaces, said conical surfaces having a common axis and a common apex; and a pair of parallel, planar end walls, said annular thermoelectric element having its inner surface in press-fit engagement with said tapered surface of said conductor; and a second conductor having an outwardly tapered surface in press-fit engagement with said outer surface of said annular thermoelectric element.

References Cited

UNITED STATES PATENTS

| | | | |
|---|---|---|---|
| 2,990,775 | 7/1961 | Henson | 136—228 X |
| 3,273,347 | 9/1966 | Elfving | 136—203 X |
| 3,287,176 | 11/1966 | McAlvay | 136—204 |

CARL D. QUARFORTH, Primary Examiner

H. E. BEHREND, Assistant Examiner

U.S. Cl. X.R.

136—208